United States Patent
Cheng et al.

(10) Patent No.: US 7,430,727 B2
(45) Date of Patent: Sep. 30, 2008

(54) HARDWARE COMPONENT GRAPH TO HARDWARE DESCRIPTION LANGUAGE TRANSLATION METHOD

(75) Inventors: Fu-Chiung Cheng, Taipei (TW); Shu-Ming Chang, Taipei (TW); Jian-Yi Chen, Taipei (TW); Chieh-Ju Wang, Taipei (TW); Chin-Tai Chou, Taipei (TW); Nian-Zhi Huang, Taipei (TW); Chi-Huam Shieh, Taipei (TW); Ping-Yun Wang, Taipei (TW); Li-Kai Chang, Taipei (TW)

(73) Assignee: Tatung Company, Taipei (TW)

( * ) Notice: Subject to any disclaimer, the term of this patent is extended or adjusted under 35 U.S.C. 154(b) by 141 days.

(21) Appl. No.: 11/440,065

(22) Filed: May 25, 2006

(65) Prior Publication Data

US 2007/0157147 A1   Jul. 5, 2007

(30) Foreign Application Priority Data

Dec. 30, 2005   (TW) .............................. 94147594 A

(51) Int. Cl.
G06F 17/50   (2006.01)

(52) U.S. Cl. .................. 716/3; 716/1; 716/18

(58) Field of Classification Search ............... 716/1–3, 716/18
See application file for complete search history.

(56) References Cited

U.S. PATENT DOCUMENTS

| | | | | |
|---|---|---|---|---|
| 5,491,640 | A * | 2/1996 | Sharma et al. | 716/18 |
| 6,363,520 | B1 * | 3/2002 | Boubezari et al. | 716/18 |
| 6,493,863 | B1 * | 12/2002 | Hamada et al. | 716/18 |
| 6,964,029 | B2 * | 11/2005 | Poznanovic et al. | 716/7 |
| 7,246,331 | B2 * | 7/2007 | Ward | 716/4 |

* cited by examiner

*Primary Examiner*—Jack Chiang
*Assistant Examiner*—Nghia M Doan
(74) *Attorney, Agent, or Firm*—Bacon & Thomas, PLLC

(57) ABSTRACT

An HCG to HDL translation method, which can automatically generate VHDL codes. The method reads a hardware component graph (HCG) to find a start node and obtain a corresponding hardware component subgraph of the start node, analyzes all information of the start node to thereby add input and output components and generate a VHDL entity, determines types on all nodes of the hardware component, graph to thereby generate corresponding VHDL components and write associated information in a VHDL architecture, generates corresponding signal connections of VHDL components in accordance with edges of the hardware component graph, and outputs the VHDL entity and architecture to a file in a text form.

6 Claims, 21 Drawing Sheets

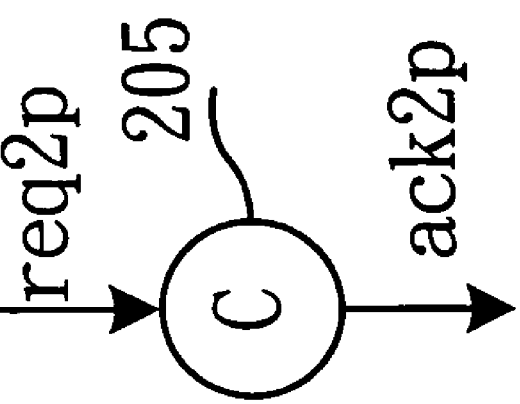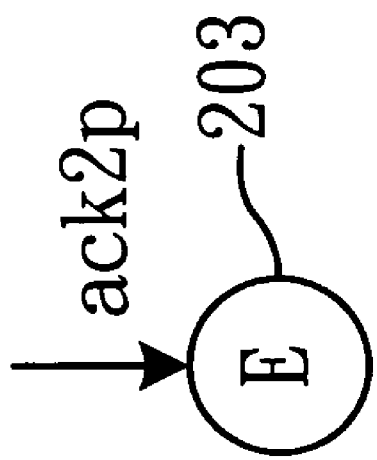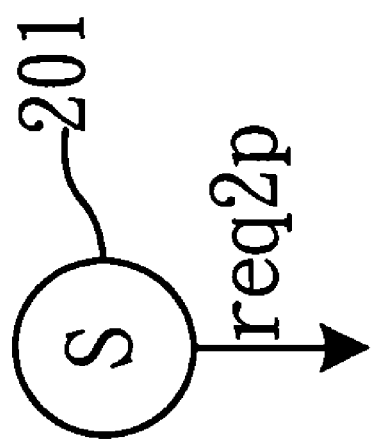
FIG. 2

```
public class SummationWhile {
    public static int sumTo(int cnt) {
        int sum = 0, i = 0;
        while (i < cnt) {
            i++;
            sum+=i;
        }
        return sum;
    }
    public static void main(String[] args) {
        System.out.println(SummationWhile.sumTo(9));
    }
}
```

FIG. 5

```
public class Math {
   private int add(int a, int b)    {
      return a+b;
   }
   public static int test(int c, int d) {
      return add(c,d);
   }
}
```

FIG. 7

```
LIBRARY ieee;
USE ieee.std_logic_1164.all;
USE work.Control2p.all;
USE work.Converters.all;
USE work.Datapath4p.all;
USE work.Basiccells2r.all;
ENTITY Math IS
    PORT(
        testzIzIReq4p : IN STD_LOGIC;
        testzIzIAck4p : OUT STD_LOGIC;
        d1 : IN STD_LOGIC_VECTOR(31 DOWNTO 0) ;
        d0 : IN STD_LOGIC_VECTOR(31 DOWNTO 0) ;
        dAck4P : OUT STD_LOGIC;
        c1 : IN STD_LOGIC_VECTOR(31 DOWNTO 0) ;
        c0 : IN STD_LOGIC_VECTOR(31 DOWNTO 0) ;
        cAck4P : OUT STD_LOGIC;
        rettestzIzI1 : OUT STD_LOGIC_VECTOR(31 DOWNTO 0) ;
        rettestzIzI0 : OUT STD_LOGIC_VECTOR(31 DOWNTO 0) ;
        clr : IN STD_LOGIC
    );
END ENTITY Math;
```

FIG. 14A

```
ARCHITECTURE ArchMath OF Math IS
  SIGNAL M_START_req2p_M13_Q_req2p_3 : STD_LOGIC;
  SIGNAL M_START_req2p_M19_Q_req2p_4 : STD_LOGIC;
  SIGNAL M12_F_pa_M18_RxN_a_read_5 : STD_LOGIC;
  SIGNAL M12_F_pb_M11_RxN_b_read_6 : STD_LOGIC;
  SIGNAL M18_RxN_a_q1_M10_ADD_wa1_7 : STD_LOGIC_VECTOR(31 DOWNTO 0);
  SIGNAL M11_RxN_b_q1_M10_ADD_wb1_8 : STD_LOGIC_VECTOR(31 DOWNTO 0);
  SIGNAL M13_Q_req4p_M12_F_req_9 : STD_LOGIC;
  SIGNAL M10_ADD_q1_M8_RxN_retaddzlzI_w1_10 : STD_LOGIC_VECTOR(31 DOWNTO 0);
  SIGNAL M8_RxN_retaddzlzI_ack4p_M13_Q_ack4p_11 : STD_LOGIC;
  SIGNAL M13_Q_ack2p_M_START_ack2p_12 : STD_LOGIC;
  SIGNAL M19_Q_req4p_M16_RxN_c_read_13 : STD_LOGIC;
  SIGNAL M16_RxN_c_q1_M18_RxN_a_w1_14 : STD_LOGIC_VECTOR(31 DOWNTO 0);
  SIGNAL M18_RxN_a_ack4p_M19_Q_ack4p_15 : STD_LOGIC;
  SIGNAL M21_Q_req4p_M23_RxN_d_read_16 : STD_LOGIC;
  SIGNAL M23_RxN_d_q1_M11_RxN_b_w1_17 : STD_LOGIC_VECTOR(31 DOWNTO 0);
  SIGNAL M11_RxN_b_ack4p_M21_Q_ack4p_18 : STD_LOGIC;
  SIGNAL M19_Q_ack2p_M21_Q_req2p_19 : STD_LOGIC;
  SIGNAL M22_Q_req4p_M_START_req4p_20 : STD_LOGIC;
  SIGNAL M8_RxN_retaddzlzI_q1_M14_RxN_rettestzlzI_w1_21 : STD_LOGIC_VECTOR(31 DOWNTO 0);
```

FIG. 14B

```
SIGNAL M14_RxN_rettestzlzl_ack4p_M22_Q_ack4p_22 : STD_LOGIC;
SIGNAL M21_Q_ack2p_M22_Q_req2p_23 : STD_LOGIC;
SIGNAL M22_Q_ack2p_M_START_ack2p_24 : STD_LOGIC;
SIGNAL M_START_ack4p_M26_F_req_31 : STD_LOGIC;
SIGNAL M26_F_pa_M14_RxN_rettestzlzl_read_32 : STD_LOGIC;
SIGNAL M_START_ack4p_M8_RxN_retaddzlzl_read_34 : STD_LOGIC;
SIGNAL M8_RxN_retaddzlzl_q1_M_START_w1_35 : STD_LOGIC_VECTOR(31 DOWNTO 0);
SIGNAL M18_RxN_a_q0_M10_ADD_wa0_36 : STD_LOGIC_VECTOR(31 DOWNTO 0);
SIGNAL M11_RxN_b_q0_M10_ADD_wb0_37 : STD_LOGIC_VECTOR(31 DOWNTO 0);
SIGNAL M10_ADD_q0_M8_RxN_retaddzlzl_w0_38 : STD_LOGIC_VECTOR(31 DOWNTO 0);
SIGNAL M16_RxN_c_q0_M18_RxN_a_w0_39 : STD_LOGIC_VECTOR(31 DOWNTO 0);
SIGNAL M23_RxN_d_q0_M11_RxN_b_w0_40 : STD_LOGIC_VECTOR(31 DOWNTO 0);
SIGNAL M8_RxN_retaddzlzl_q0_M14_RxN_rettestzlzl_w0_41 : STD_LOGIC_VECTOR(31 DOWNTO 0);
SIGNAL M8_RxN_retaddzlzl_q0_M_START_w0_45 : STD_LOGIC_VECTOR(31 DOWNTO 0);
SIGNAL ONEFLAG : STD_LOGIC;
SIGNAL ZEROFLAG : STD_LOGIC;
BEGIN
```

FIG. 14C

```
M4_addzlzl: Converter4p_2p
  PORT MAP(req4p => M22_Q_req4p_M_START_req4p_20, req2p => M_START_req2p_M13_Q_req2p_3, ack2p =>
  M13_Q_ack2p_M_START_ack2p_12, ack4p => M_START_ack4p_M8_RxN_retaddzlzl_read_34, clr => clr);
M6_testzlzl: Converter4p_2p
  PORT MAP(req4p => testzlzlReq4p, req2p => M_START_req2p_M19_Q_req2p_4, ack2p =>
  M22_Q_ack2p_M_START_ack2p_24, ack4p => M_START_ack4p_M26_F_req_31, clr => clr);
M8_retaddzlzl: Reg1xn
  GENERIC MAP(HIGH => 31, LOW => 0)
  PORT MAP(read => M_START_ack4p_M8_RxN_retaddzlzl_read_34, w1 => M10_ADD_q1_M8_RxN_retaddzlzl_w1_10, w0
  => M10_ADD_q0_M8_RxN_retaddzlzl_w0_38, q1 => M8_RxN_retaddzlzl_q1_M14_RxN_rettestzlzl_w1_21, q0 =>
  M8_RxN_retaddzlzl_q0_M_START_w0_45, ack4p => M8_RxN_retaddzlzl_ack4p_M13_Q_ack4p_11, clr => clr);
  ONEFLAG <= '1';
  ZEROFLAG <= '0';
M10_ADD: Adder_DIRCA
  GENERIC MAP(HIGH => 31, LOW => 0)
  PORT MAP(wa1 => M18_RxN_a_q1_M10_ADD_wa1_7, wa0 => M18_RxN_a_q0_M10_ADD_wa0_36, wb1 =>
  M11_RxN_b_q1_M10_ADD_wb1_8, wb0 => M11_RxN_b_q0_M10_ADD_wb0_37, ci1 => ZEROFLAG, ci0 => ONEFLAG, q1
  => M10_ADD_q1_M8_RxN_retaddzlzl_w1_10, q0 => M10_ADD_q0_M8_RxN_retaddzlzl_w0_38, co1 => open, co0 => open);
```

FIG. 14D

M11_b: Reg1xn
  GENERIC MAP(HIGH => 31, LOW => 0)
  PORT MAP(read => M12_F_pb_M11_RxN_b_read_6, w1 => M23_RxN_d_q1_M11_RxN_b_w1_17, w0 =>
  M23_RxN_d_q0_M11_RxN_b_w0_40, q1 => M11_RxN_b_q1_M10_ADD_wb1_8, q0 => M11_RxN_b_q0_M10_ADD_wb0_37,
  ack4p => M11_RxN_b_ack4p_M21_Q_ack4p_18, clr => clr);

M12_F: Fork
  PORT MAP(req => M13_Q_req4p_M12_F_req_9, pa => M12_F_pa_M18_RxN_a_read_5, pb =>
  M12_F_pb_M11_RxN_b_read_6);

M13_Q: Converter2p_4p
  PORT MAP(req2p => M_START_req2p_M13_Q_req2p_3, req4p => M13_Q_req4p_M12_F_req_9, ack4p =>
  M8_RxN_retaddzlzl_ack4p_M13_Q_ack4p_11, ack2p => M13_Q_ack2p_M_START_ack2p_12, clr => clr);

M14_rettestzlzl: Reg1xn
  GENERIC MAP(HIGH => 31, LOW => 0)
  PORT MAP(read => M26_F_pa_M14_RxN_rettestzlzl_read_32, w1 => M8_RxN_retaddzlzl_q1_M14_RxN_rettestzlzl_w1_21,
  w0 => M8_RxN_retaddzlzl_q0_M14_RxN_rettestzlzl_w0_41, q1 => rettestzlzl1, q0 => rettestzlzl0, ack4p =>
  M14_RxN_rettestzlzl_ack4p_M22_Q_ack4p_22, clr => clr);

FIG. 14E

```
M16_c: Reg1xn
   GENERIC MAP(HIGH => 31, LOW => 0)
   PORT MAP(read => M19_Q_req4p_M16_RxN_c_read_13, w1 => c1, w0 => c0, q1 => M16_RxN_c_q1_M18_RxN_a_w1_14, q0
   => M16_RxN_c_q0_M18_RxN_a_w0_39, ack4p => cAck4p, clr => clr);
M18_a: Reg1xn
   GENERIC MAP(HIGH => 31, LOW => 0)
   PORT MAP(read => M12_F_pa_M18_RxN_a_read_5, w1 => M16_RxN_c_q1_M18_RxN_a_w1_14, w0 =>
   M16_RxN_c_q0_M18_RxN_a_w0_39, q1 => M18_RxN_a_q1_M10_ADD_wa1_7, q0 => M18_RxN_a_q0_M10_ADD_wa0_36,
   ack4p => M18_RxN_a_ack4p_M19_Q_ack4p_15, clr => clr);
M19_Q: Converter2p_4p
   PORT MAP(req2p => M_START_req2p_M19_Q_req2p_4, req4p => M19_Q_req4p_M16_RxN_c_read_13, ack4p =>
   M18_RxN_a_ack4p_M19_Q_ack4p_15, ack2p => M19_Q_ack2p_M21_Q_req2p_19, clr => clr);
M21_Q: Converter2p_4p
   PORT MAP(req2p => M19_Q_ack2p_M21_Q_req2p_19, req4p => M21_Q_req4p_M23_RxN_d_read_16, ack4p =>
   M11_RxN_b_ack4p_M21_Q_ack2p_18, ack2p => M21_Q_ack2p_M22_Q_req2p_23, clr => clr);
```

FIG. 14F

```
M22_Q: Converter2p_4p
  PORT MAP(req2p => M21_Q_ack2p_M22_Q_req2p_23, req4p => M22_Q_req4p_M_START_req4p_20, ack4p =>
  M14_RxN_rettestzlzl_ack4p_M22_Q_ack4p_22, ack2p => M22_Q_ack2p_M_START_ack2p_24, clr => clr);
M23_d: Reg1xn
  GENERIC MAP(HIGH => 31, LOW => 0)
  PORT MAP(read => M21_Q_req4p_M23_RxN_d_read_16, w1 => d1, w0 => d0, q1 => M23_RxN_d_q1_M11_RxN_b_w1_17,
  q0 => M23_RxN_d_q0_M11_RxN_b_w0_40, ack4p => dAck4p, clr => clr);
M26_F: Fork
  PORT MAP(req => M_START_ack4p_M26_F_req_31, pa => M26_F_pa_M14_RxN_rettestzlzl_read_32, pb => testzlzlAck4p);
END ArchMath;
```

FIG. 14G

HARDWARE COMPONENT GRAPH TO HARDWARE DESCRIPTION LANGUAGE TRANSLATION METHOD

BACKGROUND OF THE INVENTION

1. Field of the Invention

The invention relates to a hardware component graph (HCG) to hardware description language (HDL) translation method and, more particularly, to a hardware component graph (HCG) to Very High Speed Integrated Circuit Hardware Description Language (VHDL) translation method.

2. Description of Related Art

Typically hardware description languages such as VHDL, Verilog cannot directly describe the programming logic and executing the flow of a high-level programming language. Accordingly, the high-level programming language is translated into an activity diagram (AD) defined in a unified modeling language (UML). The AD is a flow description diagram that represents the programming logic and executing flow of a high-level programming language. However, the AD is not associated with physical hardware components and cannot be translated directly into a hardware description language, unless the AD is first translated into a hardware component graph (HCG). Accordingly, components of such a HCG do not have corresponding VHDL components, and the HCG cannot be translated into accurate VHDL codes. Thus, the known method cannot translate a high-level programming language into a corresponding HDL.

Therefore, it is desirable to provide an improved method to mitigate and/or obviate the aforementioned problems.

SUMMARY OF THE INVENTION

The object of the invention is to provide an HCG to HDL translation method, which can automatically generate codes of an HDL.

To achieve the object, a hardware component graph (HCG) to hardware description language (HDL) translation method is provided, in which the HCG includes one or more start nodes and multiple component nodes. The method includes: (A) reading a hardware component graph, wherein the hardware component graph has multiple hardware component subgraphs; (B) finding a start node of the hardware component graph to thereby obtain a corresponding hardware component subgraph; (C) analyzing all information of the start node to thereby add input and output components and generate a VHDL entity, and repeating the analyzing until all start nodes are complete; (D) determining types on all nodes of the hardware component graph to thereby generate corresponding VHDL components and write associated information in a VHDL architecture; (E) generating corresponding signal connections of VHDL components in accordance with edges of the hardware component graph; and (F) outputting the VHDL entity and architecture to a file in a text form.

Other objects, advantages, and novel features of the invention will become more apparent from the following detailed description when taken in conjunction with the accompanying drawings.

BRIEF DESCRIPTION OF THE DRAWINGS

FIG. 2 is a schematic graph of a start node, an end node and a component node in accordance with the invention;

FIG. 5 is a schematic view of Java codes for an addition in accordance with the invention;

FIG. 7 is a schematic view of a Java adder in accordance with the invention;

FIGS. 14A to 14G are schematic graphs of translating an HCG into VHDL codes in accordance with the invention.

DETAILED DESCRIPTION OF THE PREFERRED EMBODIMENT

Figure 1:
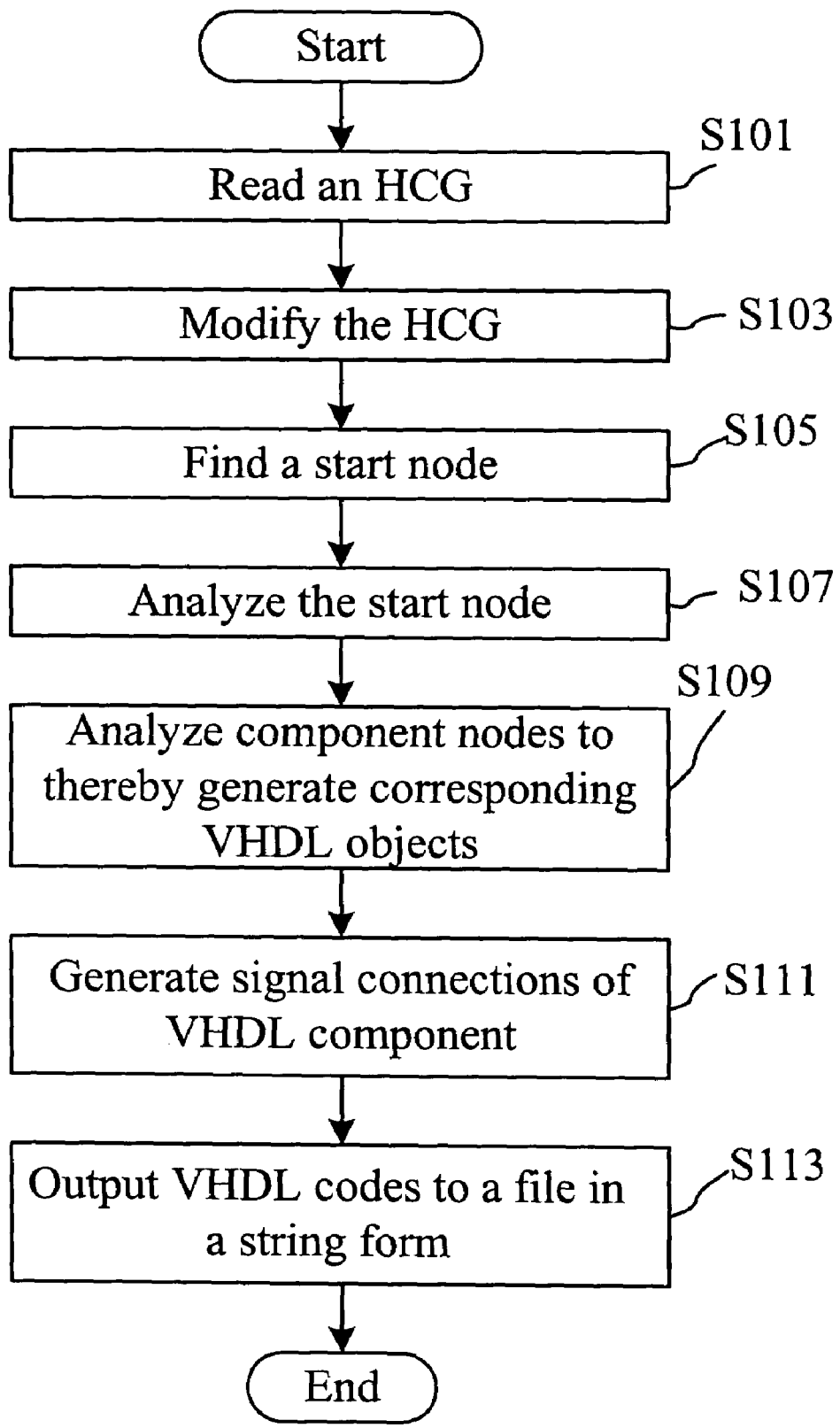
FIG. 1 is a flowchart of an HCG to VHDL translation method in accordance with the invention.

The method of the invention can translate a hardware component graph (HCG) into the Very High Speed Integrated Circuit Hardware Description Language (VHDL). The HCG includes at least one start node and multiple component nodes. FIG. 1 is a flowchart of an HCG to VHDL translation method in accordance with the invention. As shown in FIG. 1, step S101 reads an HCG having multiple hardware component subgraphs.

As shown in FIG. 2, the HCG includes three types of nodes, start node 201, end node 203 and component node 205. A node is connected to another node by a directional edge to indicate that an output port of a source object connects an input port of a target object.

The start node 201 records the information of class name, method name, parameter, local variable, global variable, return type of a Java program, wherein (1) "M" indicates the information of a method, including method name and its modifiers; (2) "R" indicates the information of a return value, including return type, bit size and return name; (3) "P" indicates the information of a parameter, including parameter type, bit size and parameter name; and (4) "L" indicates the information of local variable including local variable type, bit size and local variable name.

The end node 203 indicates that a method is ended, and a variable name to be returned is labeled. When the content of the end node 203 contains a keyword "VOID", it indicated that no variable is returned.

Figure 3:
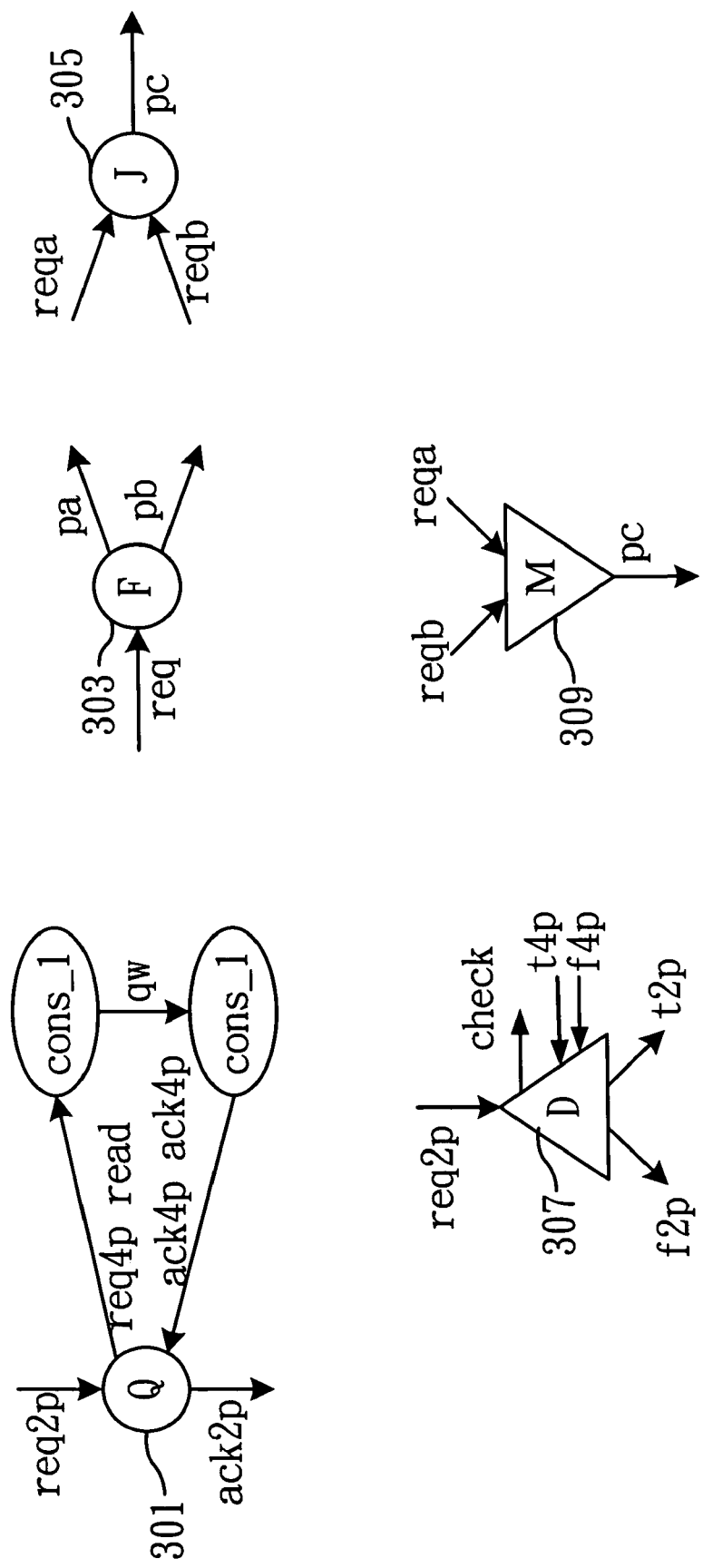
FIG. 3 is a schematic graph of a control path module in accordance with the invention.

The component node 205 is a hardware component of register, fork-element, adder or the like. The component node 205 can be grouped by disposition into control path modules and data path modules. Referring to FIG. 3, the control path modules include sequential element (notation "Q") 301, fork-element (notation "F") 303, join-element (notation "J") 305, decoder-element (notation "D") 307, merge-element ("M") 309 and micro-operation (not shown).

A Q-element 301 indicates that the hardware corresponding to the Q-element 301 requires performing in sequence. A fork-element 303 indicates that the hardware corresponding to the fork-element 303 requires performing in parallel. A join-element 305 indicates that the hardware corresponding to the join-element 305 sends an output signal only when all associated operations are arrived. A decoder-element 307 indicates that the hardware corresponding to the decoder-element 307 selects an appropriate output signal after decoding. A merge-element 309 indicates that the hardware corresponding to the merge-element 309 merges input signals to output. A micro-operation indicates that the hardware corresponding to the micro-operation executes an expression statement or expression processing.

Figure 4:
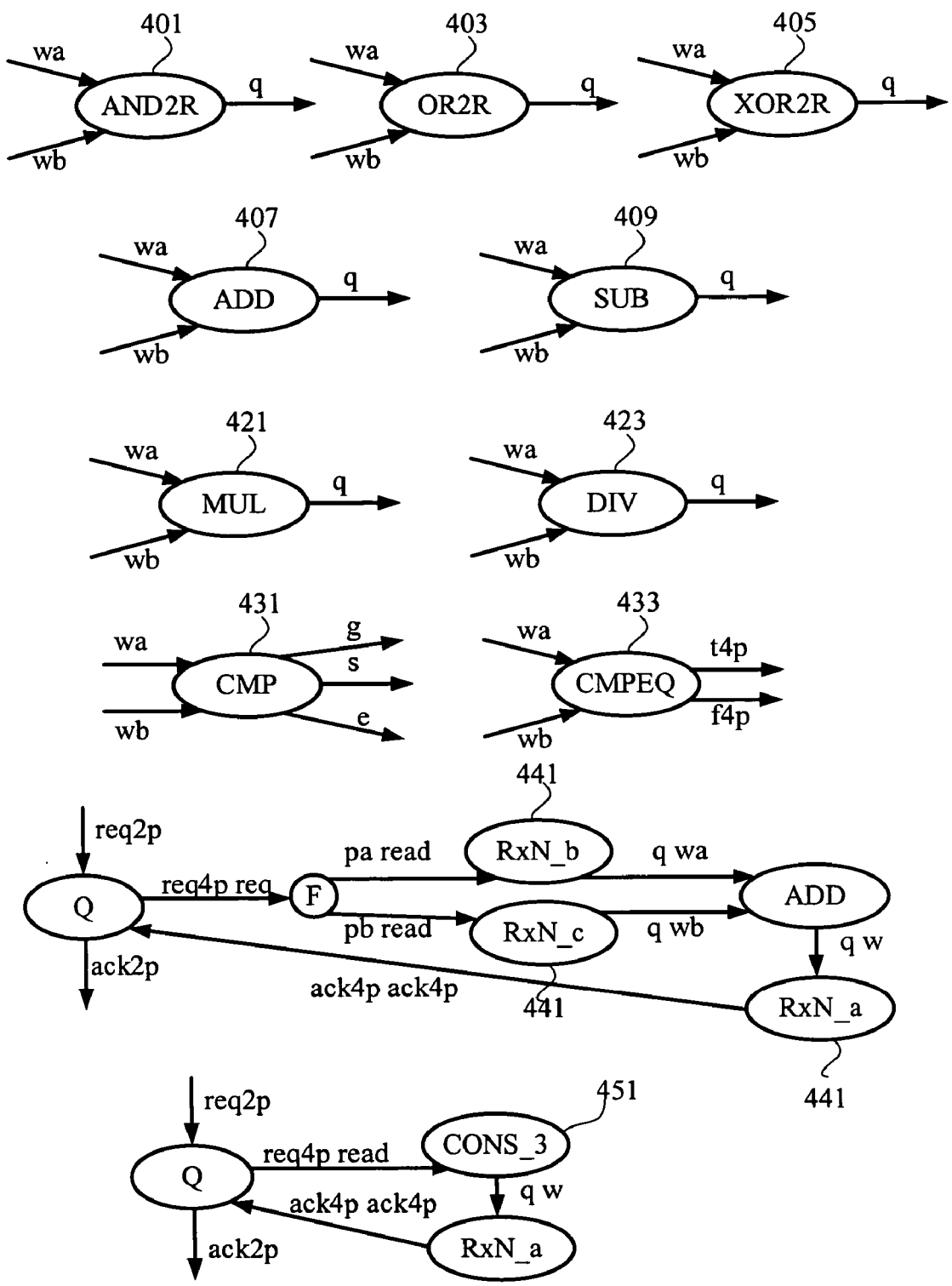
FIG. 4 is a schematic graph of a data path module in accordance with the invention.

Referring to FIG. 4, the data path modules include arithmetic logic unit (ALU), compare-element, register-element 441 and constant 451.

The ALU is divided into AND-element (notation "AND2R") 401, OR-element (notation "OR2R") 403, XOR-element (notation "XOR2R") 405, addition-element (notation "ADD") 407, subtraction-element (notation "SUB") 409, multiplication-element (notation "MUL") 421, and division-element (notation "DIV") 423.

The compare-element is divided into great and small comparison element (notation "CMP") 431 and equal comparison element (notation "CMPEQ") 433.

The content of the component node 205 can be represented as follows.

(1) The registers and the constants, which require labels to separate, can be expressed as:
Component_name_variable_name.

(2) The CMP-element 431, the merge-element 309 and the like, which do not require labels, can be expressed directly as:
Component_name.

In addition, the directional edge between the nodes can be expressed as:
source node output port→target node input port.

In FIG. 4, the edge labels are shown.

Figure 6:
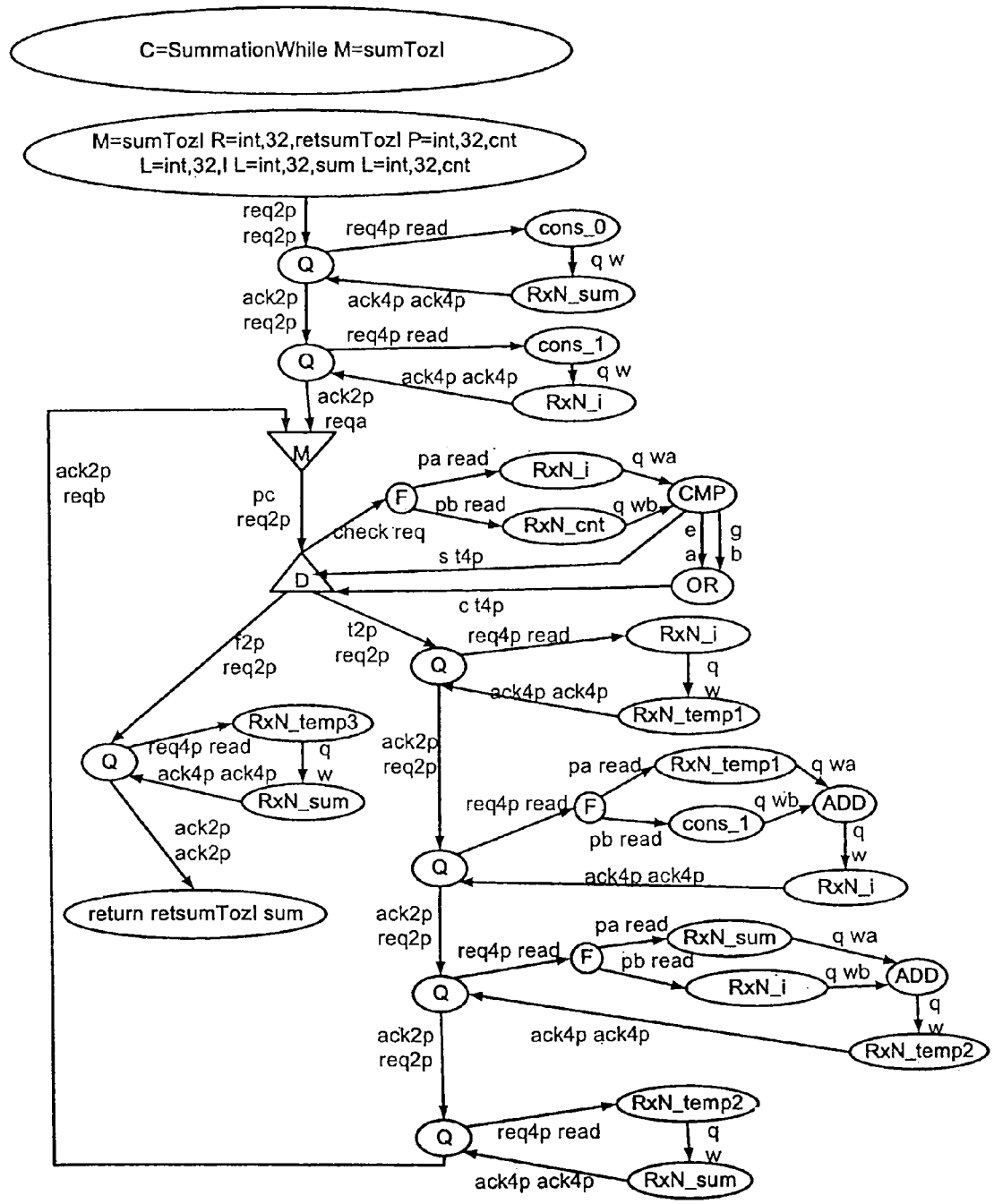
FIG. 6 is a schematic graph of a hardware component device of FIG. 5 in accordance with the invention.

FIG. 5 is Java codes for a summation operation, and the HCG of which is shown in FIG. 6. As shown in FIG. 6, the uppermost two nodes are the start node 201, which respectively record the Java information of class and method, and the last node is the end node 203, which indicates that the method is ended with a return value request. The other nodes indicate the hardware components of registers, micro-operations, F-elements 303 and ADD-elements 407, and a directional edge between the nodes is used to indicate that an output port of a source object connects an input port of a target object.

Referring again to FIG. 1, step S103 modifies the HCG, for the HCG is not associated with physical hardware components and cannot be translated directly into a VHDL language. Thus, the components defined in the modified HCG and the VHDL language can match to each other. An example is given in the Java adder of FIG. 7, and an HCG corresponding to the Java adder of FIG. 7 is shown in FIG. 8.

Figure 8:
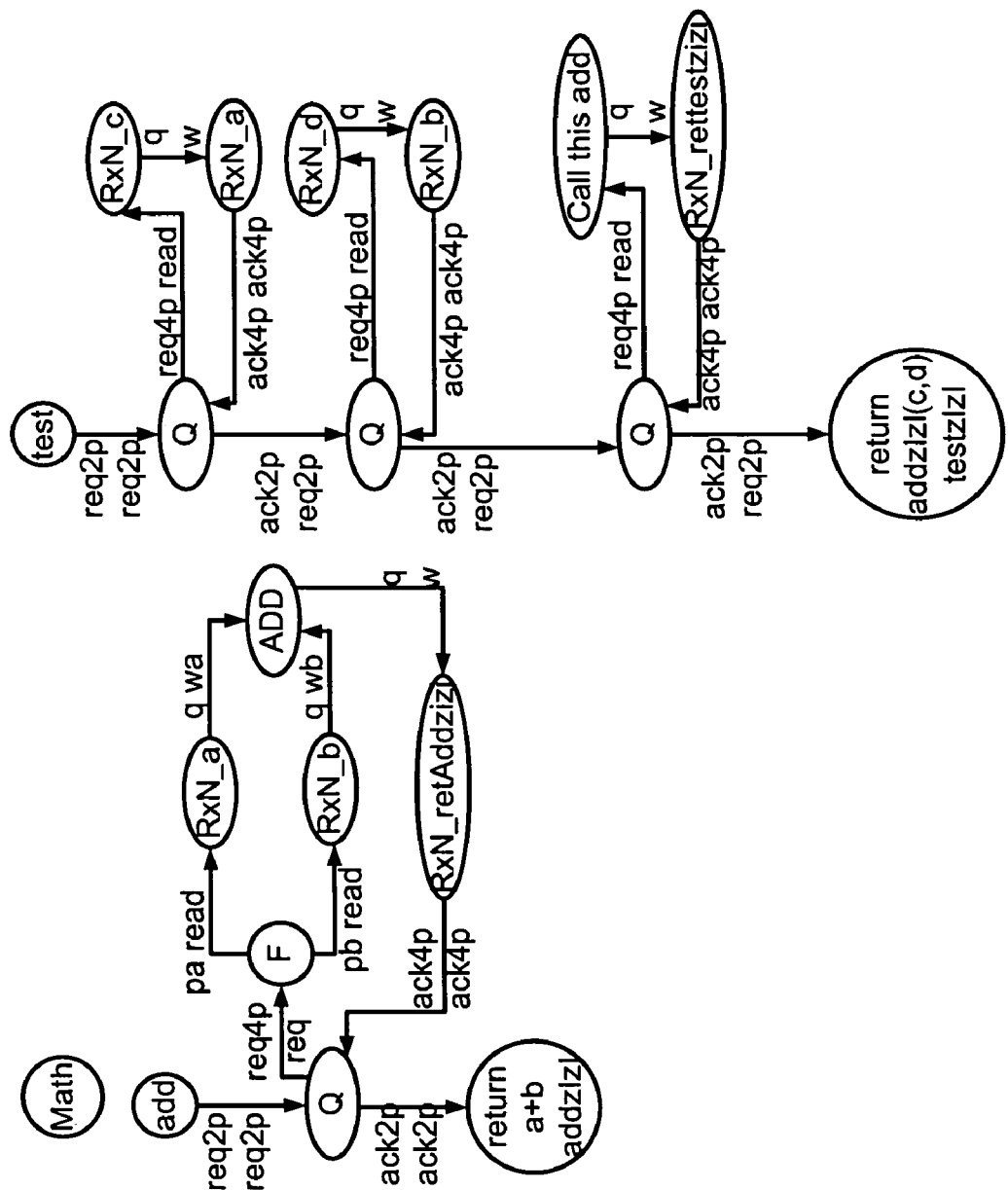
FIG. 8 is a schematic graph of an HCG of the Java adder of FIG. 7 in accordance with the invention.
Figure 9:
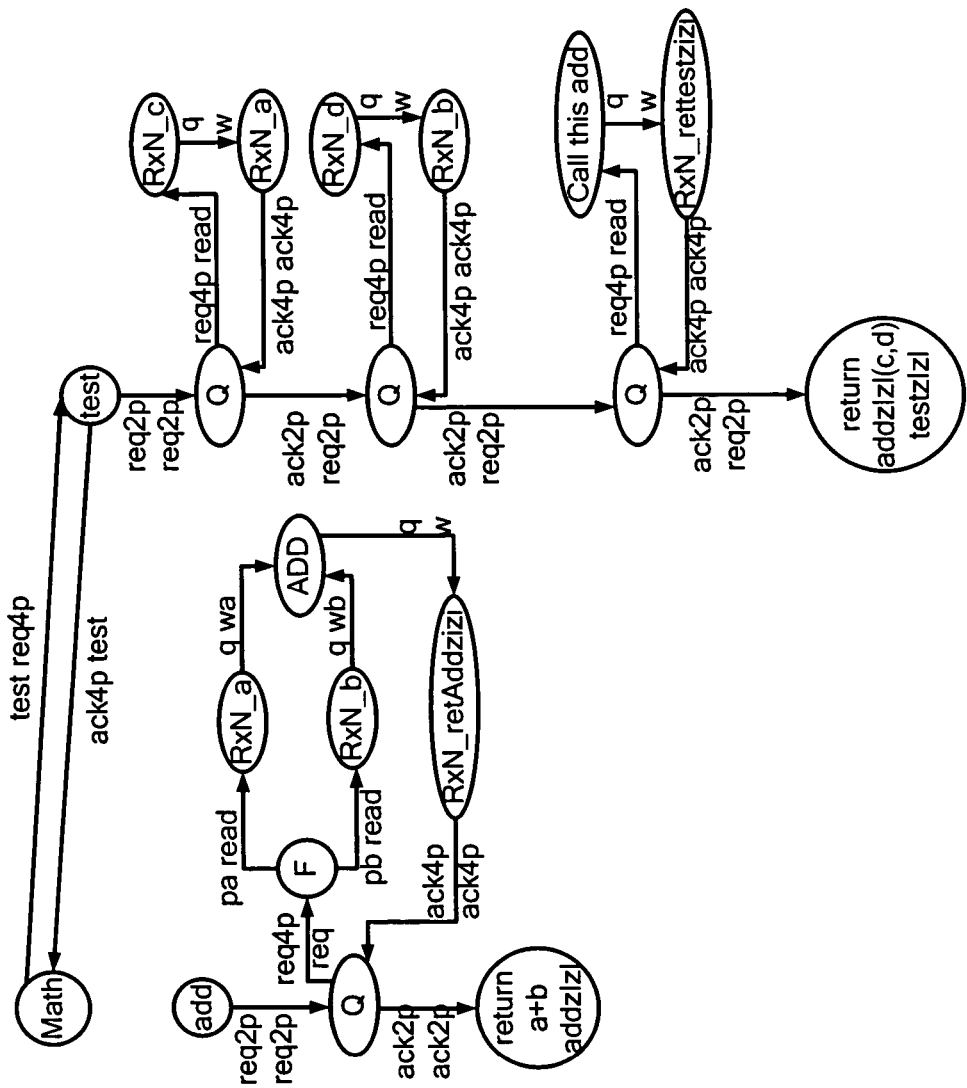
FIGS. 9 to 13 are schematic graphs of modifying the HCG of FIG. 8 in accordance with the invention.

Referring to FIGS. 7 to 9, a public method named "test" is first found in accordance with the class information and the HCG, and then an edge labeled "method_name req4p" is formed to connect a class start node to a method start node. In this case, the label on the edge indicates that the public method "test" has an input signal named "test req4p" on a corresponding hardware interface and the input signal is connected to a port named "req4p" at the method start node. Similarly, an edge labeled "ack4p method_name" is formed to connect the method start node to the class start node. In this case, the label "ack4p test" on the edge indicates an output signal named "test ack4p" on the hardware interface, which comes through a final connection from a port named "ack4p" at the method start node.

Figure 10:
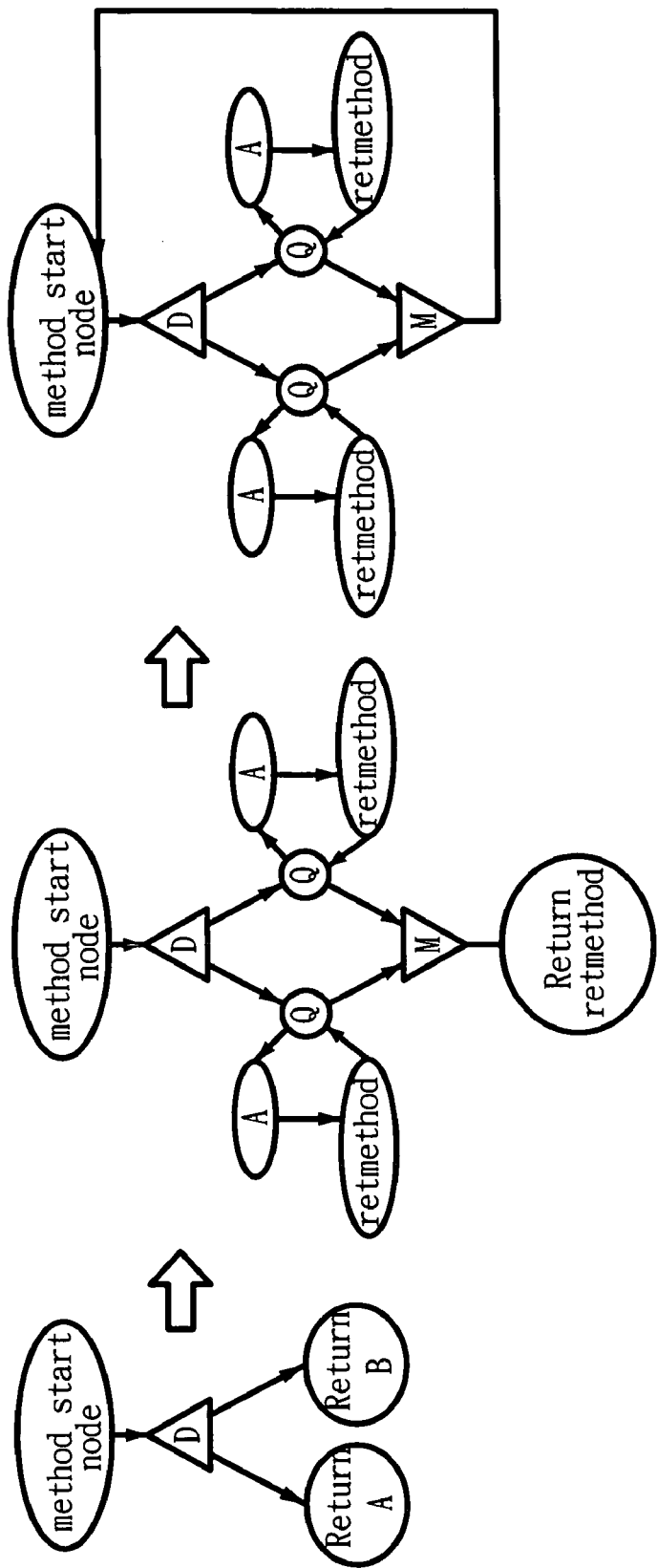

Each return can send a data and an end signal back to a start node. Accordingly, if a discriminant is found, multiple return values can be received. To overcome this, as shown in FIG. 10, multiple return nodes are merged by storing all return values to be sent in a register containing the name "ret-Method_name" (such as the oval nodes "retmethod"), using a merge element "M" to connect a signal line to an end node labeled "return retMethod_name" (such as "Return retmethod"), and eliminating the end node in order to connect the merge node back to the method start node since the end node indicates only a flow end without any meaning in hardware and an acknowledgement is not returned to indicate an execution end in an asynchronous system.

Figure 11:
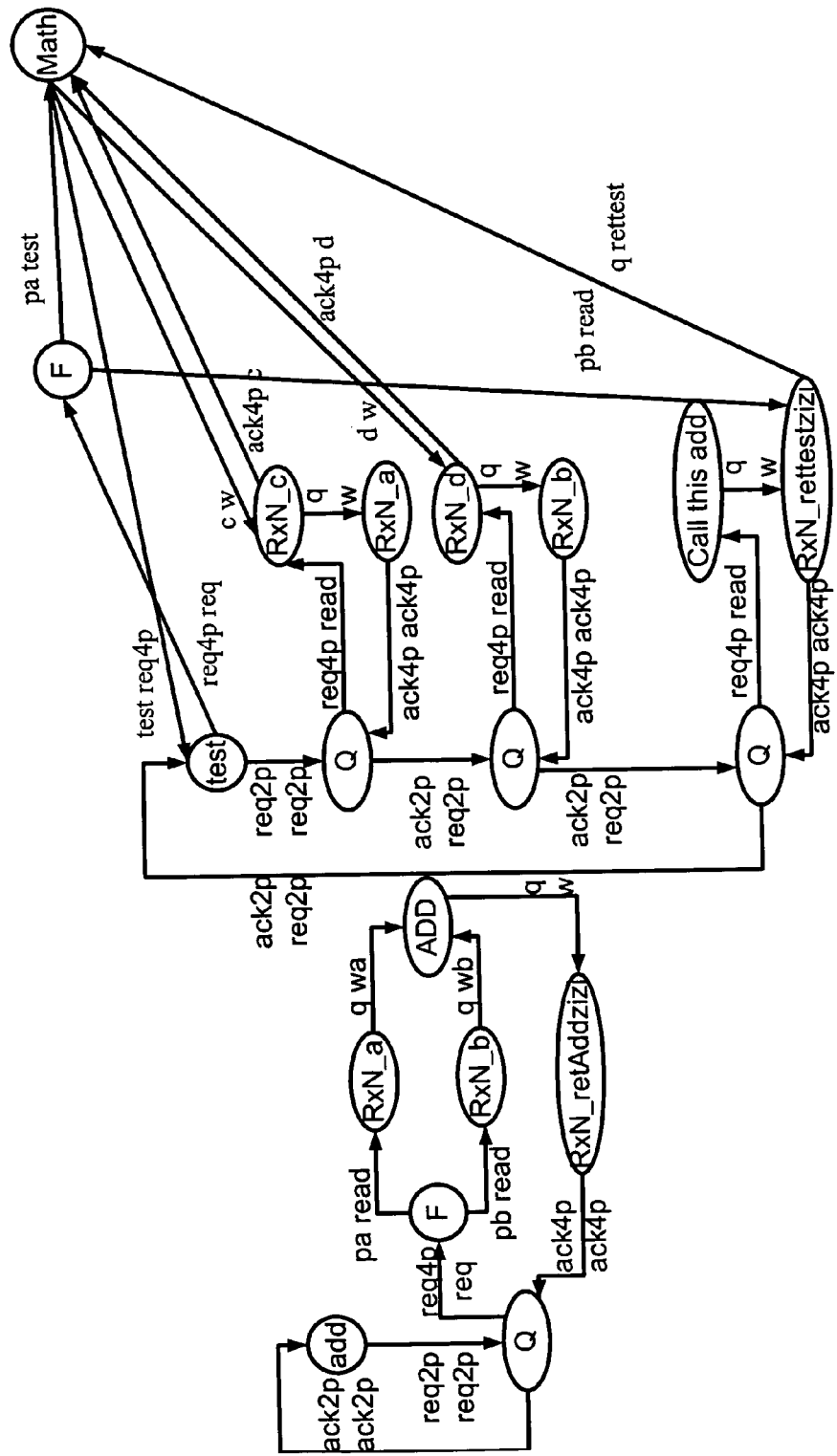

Upon the class information and the HCG, public parameters and return values in the HCG can be found. As shown in FIG. 11, the nodes corresponding to the public parameters and return values found are linked to the class start node, which indicates that the nodes have corresponding hardware interfaces for external signal input and output. For a public parameter, an input signal line labeled "parameter_name w" is connected from the class start node to a register node containing the public parameter, which indicates that data is input from the hardware interface to a register indicated by the register node. In addition, a signal line labeled "ack4p parameter_name" is connected from the register node to the hardware interface, which indicates that an acknowledgement is returned from the register to the hardware interface. For a return value, a signal line is connected from the method start node to a return value register node. Because the port for output is identical to that connected to the class start node, a fork node is used to divide the line connected to the class start node into two, such that one can be connected to the return register node ("RxN_rettestzizi"). Also, the return register node uses a line to connect to the class start node for indicating a return value output labeled "q retMethod_name ("q rettest")".

Figure 12:
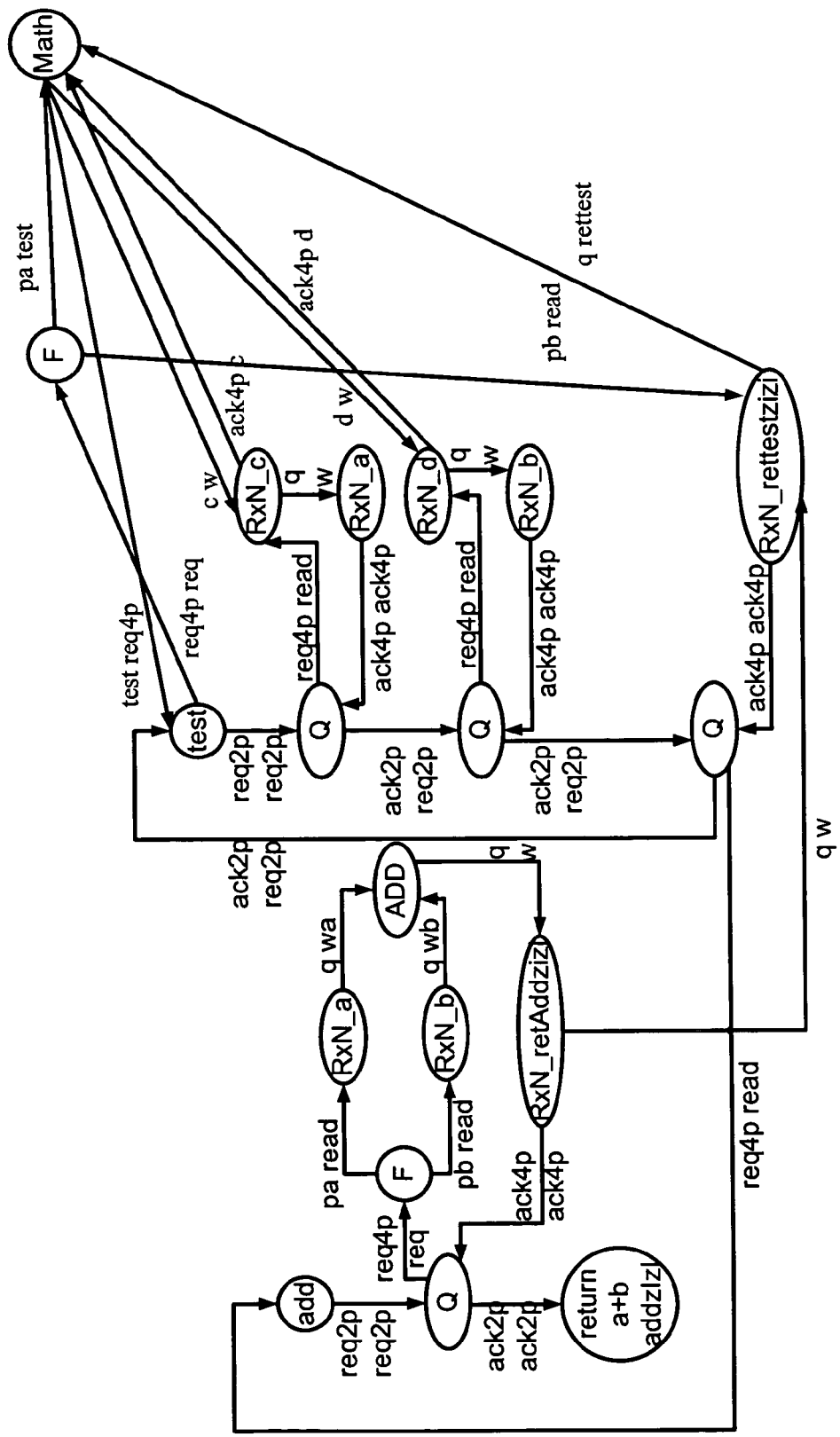

As shown in FIG. 12, the method information is collected from the class information and the in/out edges or lines are collected from the HCG, thereby generating required method call information. The method call information is further used to change the edges in the HCG from the method call node to the method start node to thereby represent the method calls. At processing the edges, one or more multiplexers and demultiplexers are added to control corresponding inputs and outputs.

Figure 13:
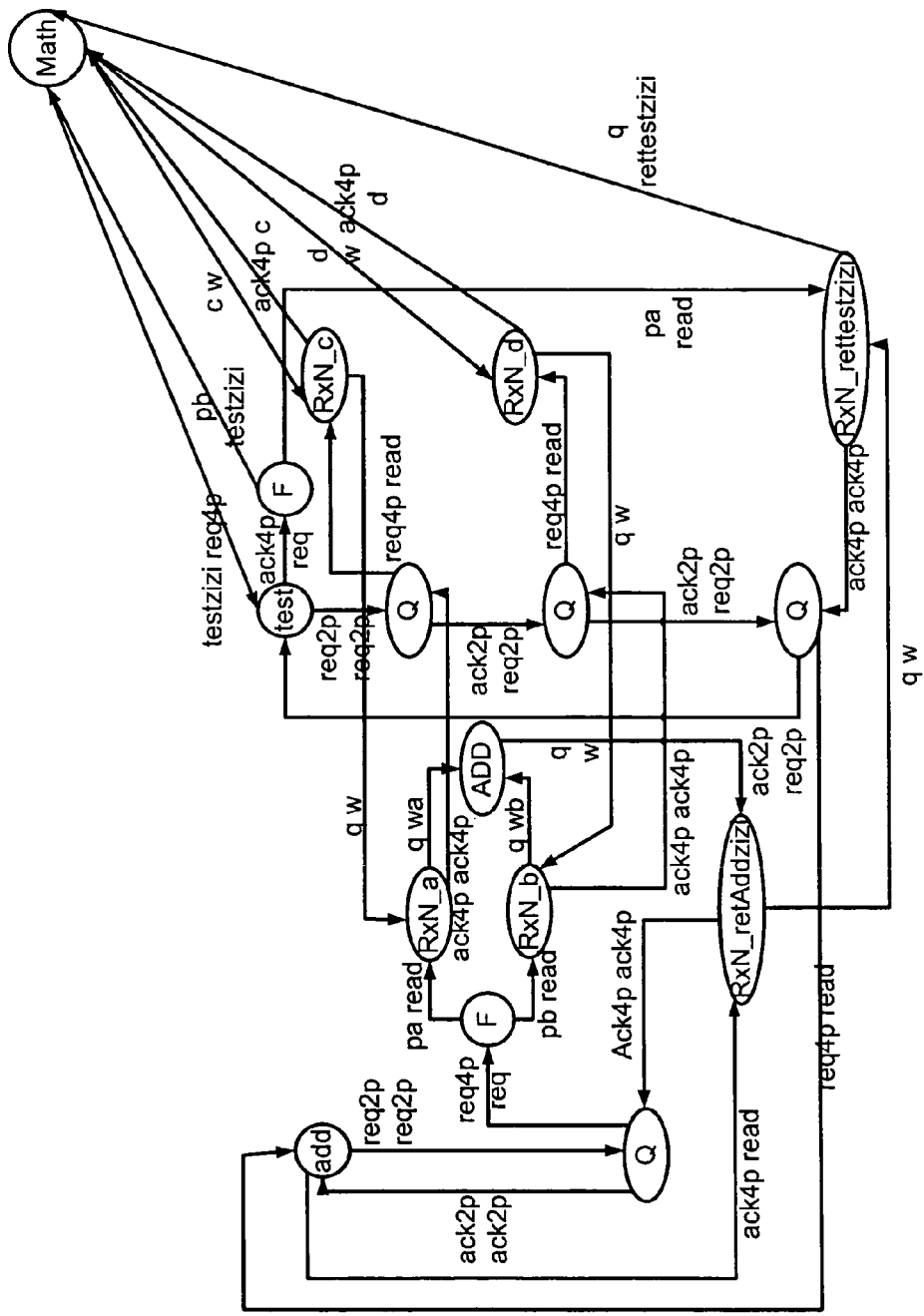

If multiple registers shown in the HCG have a same label, it indicates the multiple registers are the same. In this case, the registers are merged to form a modified HCG, as shown in FIG. 13.

Step S105 finds a start node of the modified HCG to thereby obtain a corresponding hardware component subgraph (briefly, subgraph). The start node found in step S105 is a method start node. Because the nodes in the modified HCG can be related to the respective VHDL objects, a translation to the VHDL objects can start with the method start node.

Step S107 analyzes the information, of the method start node to thereby add input and output components and generate a VHDL entity, and repeats until all start nodes are analyzed. FIGS. 14A to 14G are the VHDL codes obtained after the translation in accordance with the invention. In FIGS. 14A to 14G, an entity name directs to a method start node, and the edges of the method start node are translated into in/out ports of the entity.

Step 109 determines a type for each node of the modified HCG to thereby generate corresponding VHDL components and write associated information in a VHDL architecture. The VHDL components are generated by a component instantiation. For example, the node "test" in FIG. 13 is translated into a component containing a label "M6_testzIzI" in FIGS. 14A to 14G, and the node "RxN_retAddzizi" in FIG. 13 is translated into a component containing a label "M8_retaddzIzI" in FIGS. 14A to 14G.

Figure 15:
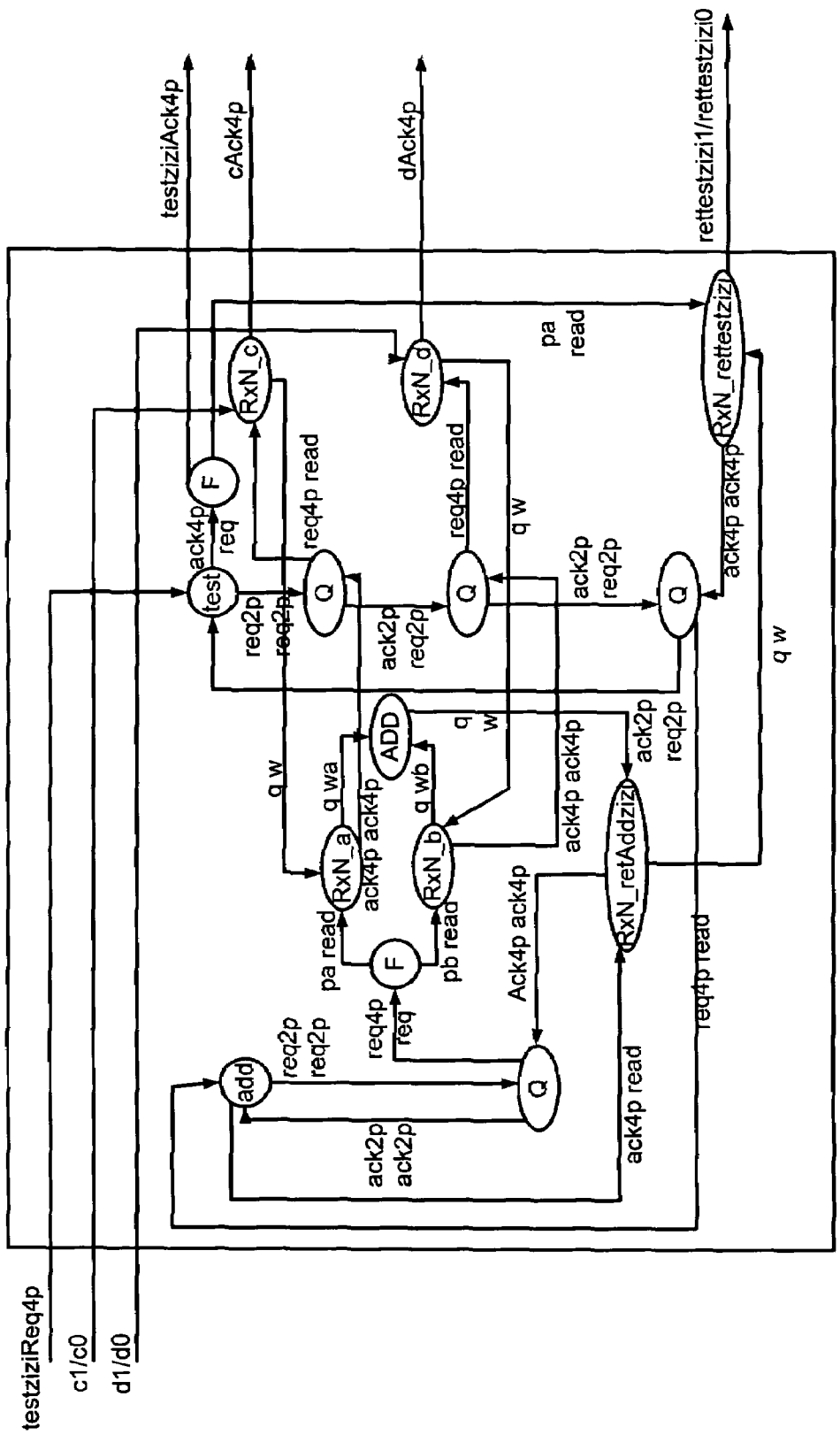
FIG. 15 is a schematic graph of a synthesis circuit generated from an output of VHDL codes in accordance with the invention.

Step S111 generates corresponding signal connections of the VHDL components in accordance with the edges of the modified HCG. Step S113 outputs the entity and architecture to a file in a text form, as shown in FIG. 14A to 14G. FIG. 15 is a synthesis circuit generated from an output of the VHDL codes in accordance with the invention.

In view of the foregoing, it is known that the invention modifies an HCG to generate a modified HCG, which can correspond to each VHDL component, such that the modified HCG can be translated into the VHDL codes easily. Thus, the prior problem that the HCG cannot be translated into the accurate VHDL codes is overcome.

Although the present invention has been explained in relation to its preferred embodiment, it is to be understood that many other possible modifications and variations can be made without departing from the spirit and scope of the invention as hereinafter claimed.

What is claimed is:

1. A hardware component graph (HCG) to VHSIC (Very High-Speed Integrated Circuit) hardware description language (VHDL) translation method, the HCG including at least one start node and multiple component nodes, the method comprising the steps of:
    (A) reading a hardware component graph, wherein the hardware component graph has multiple hardware component subgraphs;
    (B) finding a start node of the hardware component graph to thereby obtain corresponding hardware component subgraphs, and finding start nodes of the corresponding hardware component subgraphs;
    (C) analyzing all information of a respective one of the start nodes of the corresponding hardware component subgraphs to thereby add input and output components and generate a VHDL entity, and repeating the analyzing until analyses of all said start nodes are complete;
    (D) determining types on all nodes of the hardware component graph and the hardware component subgraphs to thereby generate corresponding VHDL components and write associated information in a VHDL architecture;
    (E) generating corresponding signal connections of VHDL components in accordance with all edges of the hardware component graph; and
    (F) outputting the VHDL entity and architecture to a file in a text form.

2. The method as claimed in claim 1, wherein the step (A) further comprises the step of:
    (A1) translating the HCG into a modified HCG to thereby perform a VHDL translation.

3. The method as claimed in claim 1, wherein the HCG comprises an end node.

4. The method as claimed in claim 1, wherein the HCG is a flow control graph.

5. The method as claimed in claim 1, wherein the HCG indicates a connection relation between hardware components.

6. The method as claimed in claim 1, wherein step (D) applies a component instantiation to generate the corresponding VHDL components.

* * * * *